United States Patent
El-Batal (10) Patent No.: US 7,085,958 B2
(45) Date of Patent: Aug. 1, 2006

(54) SYSTEM AND METHOD FOR ISOLATING A FAULTY SWITCH, STORAGE DEVICE OR SFP IN A DAISY-CHAINED CONFIGURATION

(75) Inventor: Mohamad H. El-Batal, Westminster, CO (US)

(73) Assignee: International Business Machines Corporation, Armonk, NY (US)

( * ) Notice: Subject to any disclaimer, the term of this patent is extended or adjusted under 35 U.S.C. 154(b) by 603 days.

(21) Appl. No.: 10/346,820

(22) Filed: Jan. 17, 2003

(65) Prior Publication Data

US 2004/0153914 A1  Aug. 5, 2004

(51) Int. Cl.
  *G06F 11/00* (2006.01)
(52) U.S. Cl. ........................................................ 714/8
(58) Field of Classification Search ....................... 714/8
  See application file for complete search history.

(56) References Cited

U.S. PATENT DOCUMENTS

| | | | |
|---|---|---|---|
| 5,768,551 A * | 6/1998 | Bleiweiss et al. ............ | 710/316 |
| 5,812,754 A | 9/1998 | Lui et al. ................. | 395/182.04 |
| 6,055,228 A | 4/2000 | DeKoning et al. ........... | 370/258 |
| 6,201,787 B1 | 3/2001 | Baldwin ...................... | 370/222 |
| 6,260,079 B1 | 7/2001 | White ............................ | 710/8 |
| 6,289,002 B1 | 9/2001 | Henson et al. .............. | 370/222 |
| 6,571,355 B1 * | 5/2003 | Linnell .......................... | 714/9 |
| 6,928,581 B1 * | 8/2005 | Tretter et al. ................. | 714/8 |

\* cited by examiner

*Primary Examiner*—Robert Beausoliel
*Assistant Examiner*—Amine Riad
(74) *Attorney, Agent, or Firm*—Arthur J. Samodovitz

(57) ABSTRACT

A system for isolating a faulty switch or respective storage device from a plurality of switches and respective storage devices in a daisy-chained arrangement. In the daisy-chain arrangement the switches are connected in sequence to permit access to the respective storage devices through the preceding switches in the sequence. All of the switches, except one, are set in a bypass mode where they do not read inputs of the respective storage devices. The one switch is set in a non bypass mode where it reads an input from its associated storage device. A status of the daisy-chain, either up or down, is then determined. If the status is up, the foregoing steps are repeated a number of iterations with a different one of the switches being set in a non bypass mode and the other switches being set in the bypass mode during each iteration, until the status of the daisy-chain is down. The down status indicates that the switch which is set in the non bypass mode or its associated storage device is defective.

14 Claims, 6 Drawing Sheets

SYSTEM AND METHOD FOR ISOLATING A FAULTY SWITCH, STORAGE DEVICE OR SFP IN A DAISY-CHAINED CONFIGURATION

BACKGROUND OF THE INVENTION

The invention relates generally to data storage arrays, and deals more particularly with a technique to isolate a faulty switch, storage device or expansion connector/cable in a daisy-chained configuration of switches that permit access to respective storage devices.

Computer systems may store data in external storage media such as magnetic disks or tape or even semiconductor memory. Typically, the storage device has two components—the storage medium as noted above and a disk or tape drive to physically access the storage medium. In the case of a disk drive, there is also a storage controller which instructs the disk drive where to store and access data. The storage controller may receive I/O commands from one or more host computer systems which are local or remote (via a network). It is important that the data storage arrangement be reliable, and if there is a failure of a storage medium, a disk drive, a storage controller or the communication between the storage controller and the disk drive, that the data can be recovered. There are several, well known "RAID" architectures for ensuring reliability and recovery. These architectures provide redundancy of data on the same or different disks, distribution of data across the same or different disks, parity bits on the same or different disks as the data, redundancy of controllers for each disk drive, redundancy of communication paths between the storage controllers and the disk drives, etc. Generally, the higher the RAID "level" the greater the degree of redundancy, amount of parity bits, distribution of data and parity bits, etc. This results in greater reliability and recoverability. Currently, there are six RAID levels, RAID 0–5. These are described in "A Case for Redundant Arrays of Inexpensive Disks", Proceedings of ACM SIGMOD, June 1988 by Patterson et al.

There are different, known protocols for communication between the host and the storage controller and between the storage controller and the disk drives. A "Small Computer System Interface" (SCSI) can be used between the host and the storage controller and between the storage controller and the disk drive. However, there are limits on the number of devices on any one SCSI bus and the maximum physical length of the bus as well. Also, the SCSI interface is too slow for some high speed applications. Therefore, SCSI would not be best for a host to communicate with storage devices located on a remote network. A Fibre Channel protocol is described in the FC-PH-3 Rev-9.4, November of 1997 and FC-AL-3 Rev-1.0, September of 1999, which is hereby incorporated by reference as part of the present disclosure. Compared to SCSI, the Fibre Channel can be used over greater distances, has greater speed and allows more devices to be connected to single channel. The Fiber Channel protocol includes "Fiber Channel Arbitrated Loop" (FC-AL) connection protocol. FC-AL is a connection topology between multiple Fiber Channel devices, where the connection between the devices at any one time is arbitrated between the Fiber Channel devices.

Each storage controller can be connected to multiple disk drives for greater reliability/recovery as noted above, and to increase storage capacity. The connection between the storage controller and the disk drives can be made in a variety of configurations. There can be a single daisy-chain, redundant daisy-chain, single loop, redundant loop, simple parallel, redundant parallel, or other arrangement. In a daisy-chain arrangement, there is a series arrangement of switches accessible at one or both ends by the storage controller, one switch per disk drive. A communication from the storage controller is supplied to a first one of the switches. Each switch in succession passes the communication either to its respective disk drive or to the next switch in the sequence, (i.e. "bypass" mode). This depends on which disk drive the storage controller wants to access and a respective control signal for the switch. The control signal is supplied by the storage controller and/or an enclosure services interface ("ESI") processor associated with the daisy-chain.

In a simple parallel arrangement, there is a point-to-point connection (i.e. dedicated communication line) between the storage controller and each device driver. This allows the storage controller to access each device driver without a series of intervening switches. However, a separate communication line is required between the storage controller and each device driver. In a redundant parallel arrangement, there are two or more point-to-point connections between the storage controller and each device driver. The parallel arrangements provide the most direct and fastest connection between the storage controller and each device driver, but requires additional cabling between the storage controller and each device driver.

Occasionally, there is a failure of a storage medium, a device driver, one of the switches leading to the device drivers tin a daisy chain arrangement), a communication medium between storage controller and the switches, etc. In a daisy chained arrangement, a failure of a single storage medium, device driver, switch or communication medium could jeopardize communication between the storage controller and the failed and downstream device drivers. In many cases, if the failure is traced to a specific storage medium, device driver or switch, the faulty switch can be bypassed to restore communication between the storage controller and the downstream device drivers. It is known to attach a hardware detector to each device driver to detect a failure in the device driver or its storage medium and signal the storage controller when the device driver or its storage medium fails. This identifies the source of the failure to the storage controller which then bypasses the associated switch and device driver. A problem with such a hardware detector is the added cost to the device driver. It also may not be capable of detecting certain failures in the communication medium between the switch and the storage controller.

Accordingly, an object of the present invention is to provide a system and method to isolate a failure of a device driver, storage medium, daisy chain switch or the communication medium between the switch and the storage controller, in a daisy-chained arrangement of device drivers.

Another object of the present invention is to provide a system and method of the foregoing type that is inexpensive and does not require additional hardware.

SUMMARY OF THE INVENTION

The present invention resides in a system, method and program product for isolating a faulty switch or respective storage device from a plurality of switches and respective storage devices in a daisy-chained arrangement. In the daisy-chain arrangement the switches are connected in sequence to permit access to the respective storage devices through the preceding switches in the sequence. All of the switches, except one, are set in a bypass mode where they do not read inputs of the respective storage devices. The one switch is set in a non bypass mode where it reads an input from its associated storage device. A status of the daisy-chain, either up or down, is then determined. If the status is up, the foregoing steps are repeated a number of iterations with a different one of the switches being set in a non bypass mode and the other switches being set in the bypass mode during each iteration, until the status of the daisy-chain is down. The down status indicates that the switch which is set in the non bypass mode or its associated storage device is defective.

According to one feature of the present invention the status of the loop is determining by injecting a test signal into an input port of the daisy-chain of switches. The test signal passes through the switches set in the bypass mode upstream of the switch set in the non bypass mode and then to the storage device associated with the switch set in the non bypass mode. If the storage device associated with the switch set in the non bypass mode is functioning properly, the test signal returns to the switch set in the non bypass mode. Then, the test signal propagates downstream through one or more other switches set in the bypass mode indicating that the switch set in the bypass mode and the storage device associated with the switch set in the bypass mode are functioning properly. If the storage device associated with the switch set in the non bypass mode is not functioning properly, the test signal does not return to the switch set in the non bypass mode. Consequently, the test signal will not propagate downstream through one or more other switches set in the bypass mode indicating that the switch set in the non bypass mode or the storage device associated with the switch set in the non bypass mode is not functioning properly.

According to another feature of the present invention, there is a second daisy-chain of switches and respective storage devices, and a plurality of small form factor ports between the two daisy-chains. If all of the switches and associated storage devices in both daisy-chains are determined to be functioning properly, then the switches in both of the daisy-chains in a path from an input port of one of the daisy-chains to an output port of another of the daisy chains are set in the bypass mode. The path includes a subset of the small form factor ports which are not bypassed. Then, a test signal is sent into the input port of one of the daisy-chains. If the test signal returns out of the output port via the bypassed switches and the subset of small form factor ports, this indicates that the subset of small form factor ports is functioning properly.

BRIEF DESCRIPTION OF THE FIGURES

FIGS. 4(a–c) is a flow chart of operation of the controllers of FIGS. 1 and 2 according to the present invention.

DETAILED DESCRIPTION OF THE PREFERRED EMBODIMENTS

Figure 1:
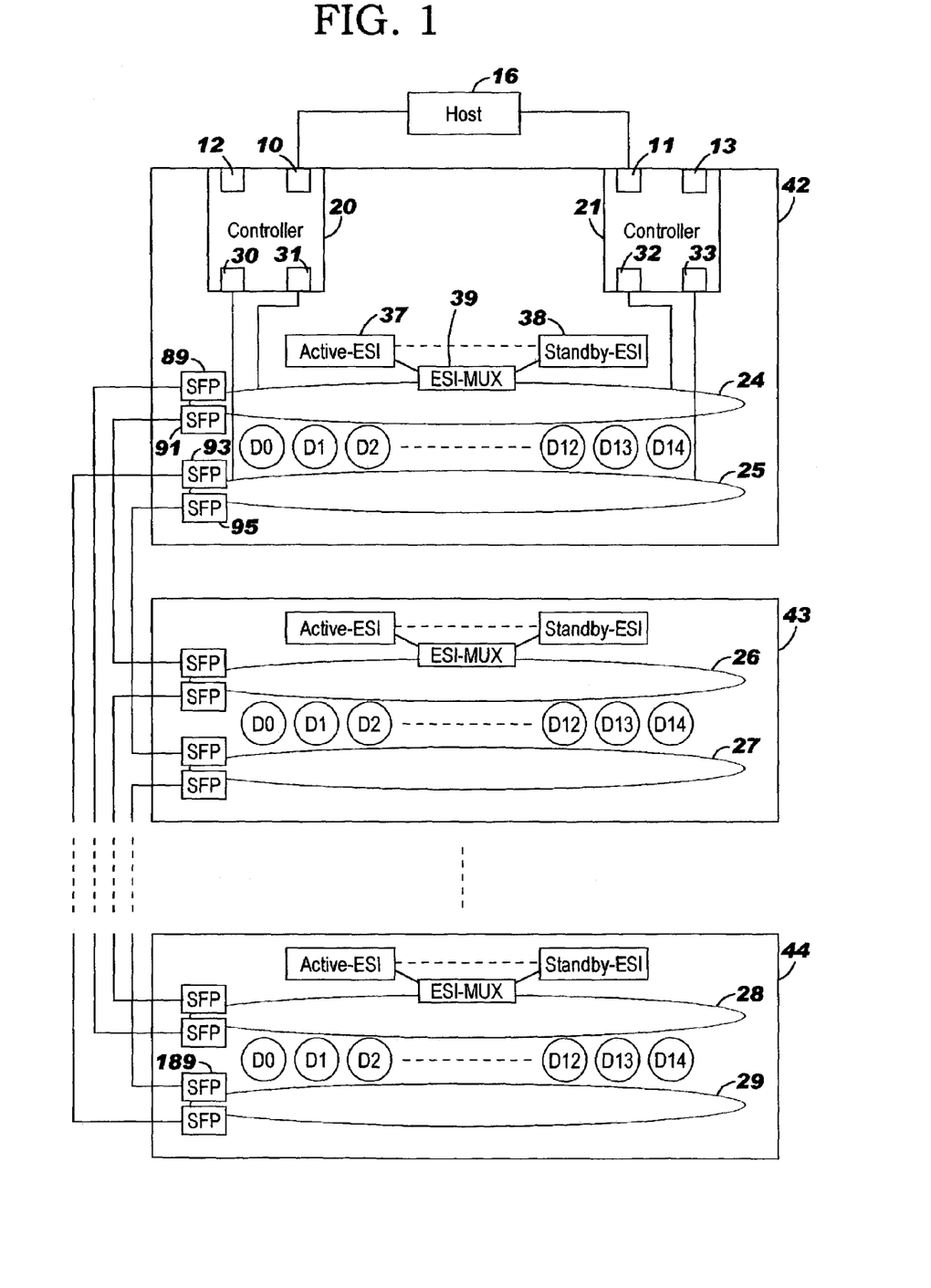
FIG. 1 is a block diagram of two redundant storage controllers, and multiple pairs of parallel daisy-chained loops of device drivers, according to the present invention.

Referring now to the drawings in detail, wherein like reference numbers indicate like elements throughout, FIG. 1 is a block diagram of a host 16, two redundant storage controllers 20 and 21, and multiple pairs of parallel daisy-chained loops 24, 25 and 26, 27 and 28, 29 of storage devices ("D0–D14"), according to the present invention. Host 16 is connected to a host port 10 and 11 on controllers 20 and 21, respectively. (If desired, host 16 can also be connected to host ports 12 and 13 on controllers 20 and 21 for redundancy, or another host can be connected to host ports 12 and 13.) The host 16 issues I/O commands to the storage controllers, and can be connected to the storage controllers via simple cabling or a network. Each of the controllers has two, device I/O processors 30, 31 and 32, 33, respectively, to communicate with the daisy-chained loops, both to instruct the device drivers and to monitor status of the loops. Each loop comprises a series of switches (shown in more detail in FIG. 3), one switch for each device driver. The switches provide a daisy-chained configuration of device drivers. The number of device drivers depends on the storage requirements and RAID level of the system. Each storage controller 20 and 21 interfaces to both series of switches in both loops 24 and 25 to provide redundancy. Each of the storage controllers can communicate with each of the loops using Fibre Channel protocol. There are two ESI processors 37 and 38 for each pair of loops, one processor is primary and the other processor is standby. There is also an ESI multiplexor 39 for each pair of loops to select individual switches for control by the ESI processor.

In the illustrated embodiment, each pair of loops is contained in a separate "JBOD" (Just a Bunch of Disks) enclosure 42, 43 and 44 with one of the enclosures 42 also containing the two storage controllers. In this arrangement, enclosures 43 and 44 are storage "expansions" of enclosure 42. If desired, more than one pair of loops can be contained in each enclosure. Loop 24 is coupled to loop 26 via small form factor ("SFP") expansion ports on each loop and intervening cabling, electric or optical. Likewise, loop 25 is coupled to loop 27 via small form factory ("SFP") expansion ports on each loop and intervening cabling, electric or optical.

Figure 2:
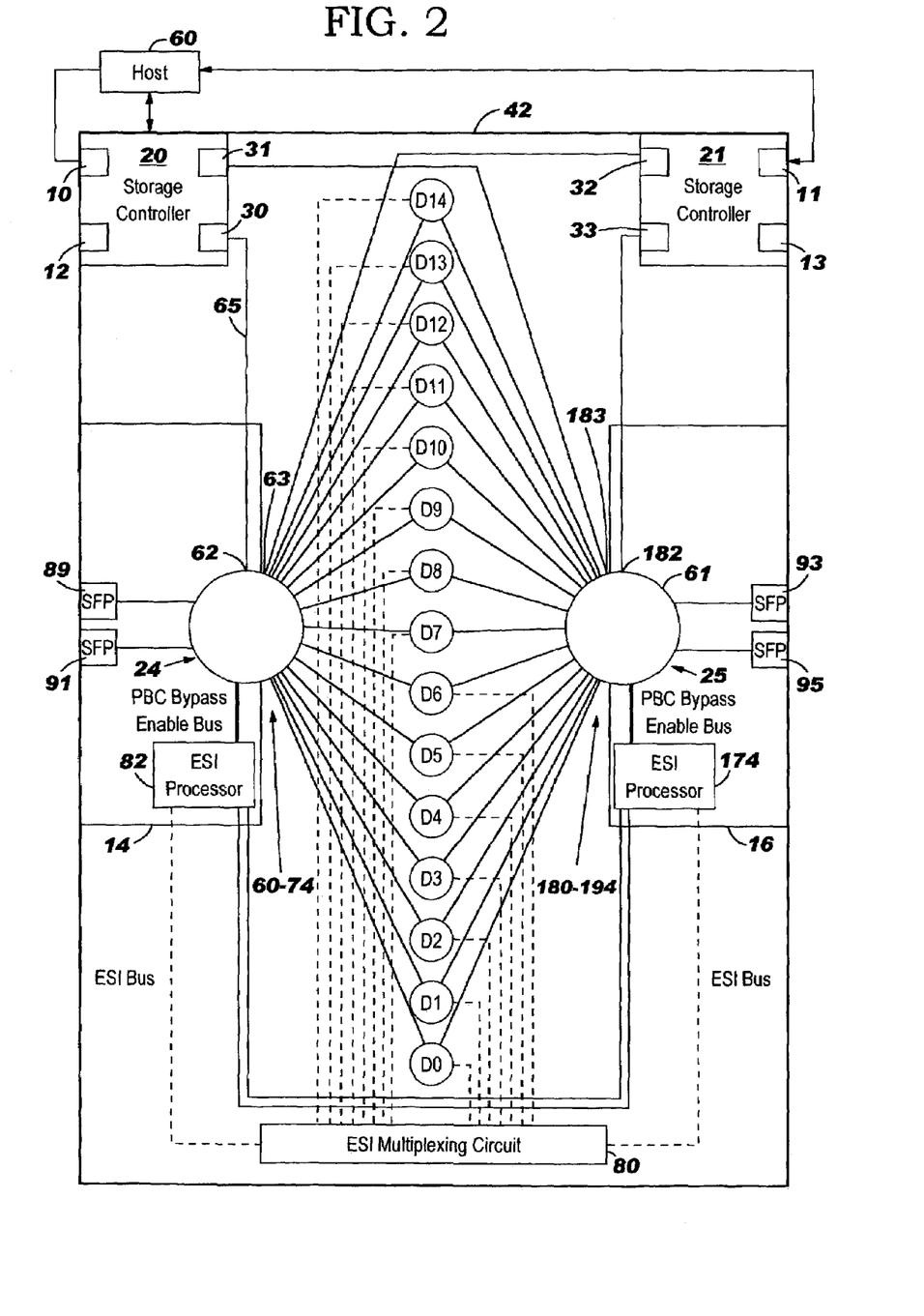
FIG. 2 is a block diagram of the two storage controllers and one pair of the parallel daisy-chained loops of FIG. 1, according to the present invention.

FIG. 2 is a block diagram of storage controllers 20 and 21 and one pair of the parallel daisy-chained loops 24 and 25. In the illustrated example, there are fifteen storage devices D0–D14 comprising respective device drivers and respective (DASD) storage disks. Loop 24 comprises fifteen series switches 60–74, one for each storage device. Likewise, for redundancy, loop 25 comprises fifteen series switches 180–194, one for each storage device. Storage controller 20 is coupled to both sets of series switches via device I/O processor 30 and device I/O processor 31 and respective electrical or optical cabling. Likewise, storage controller 21 is coupled to both sets of series switches via device I/O processor 32 and device I/O processor 33 and respective electrical or optical cabling.

Figure 3:
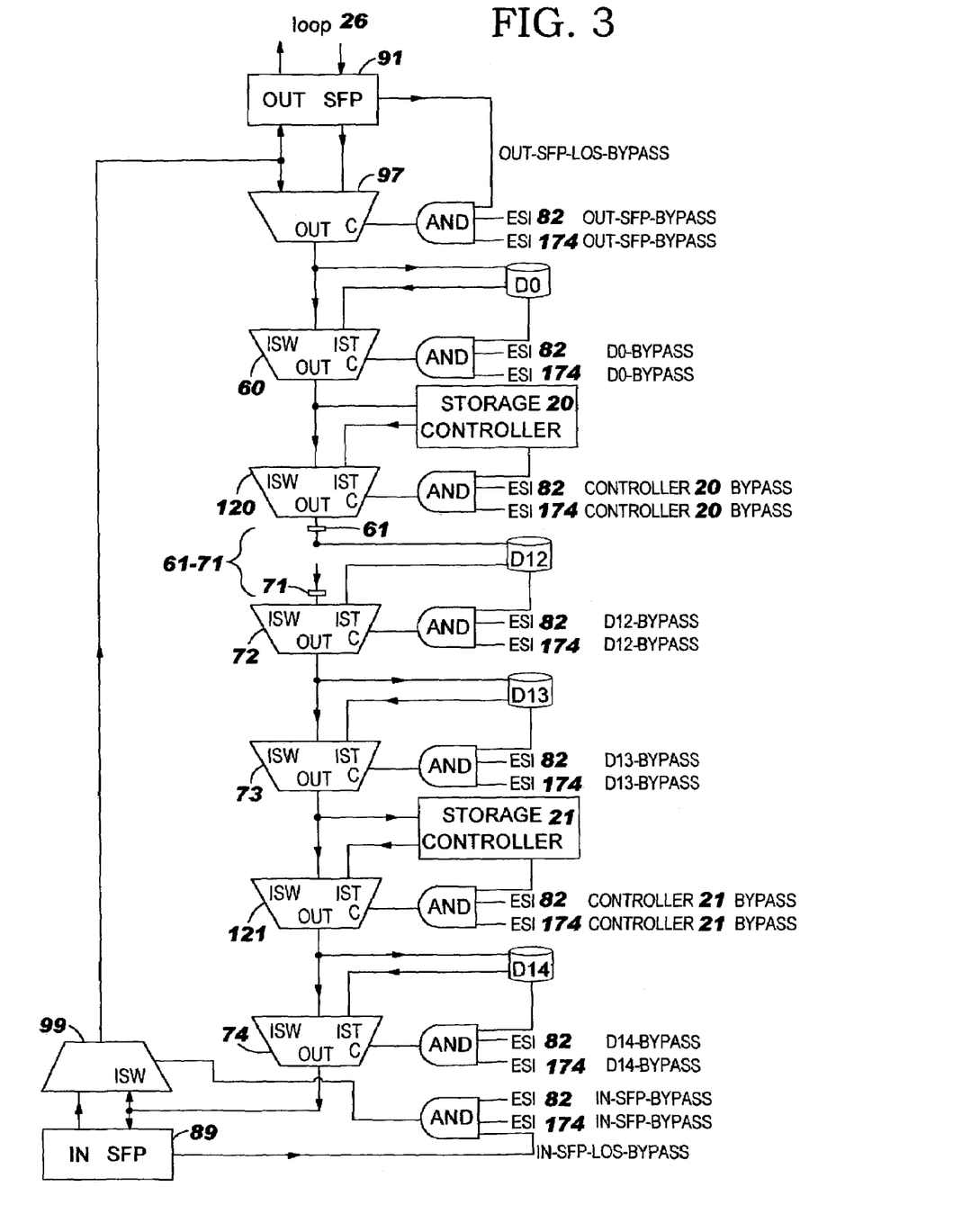
FIG. 3 is a circuit diagram of a series of switches for the parallel daisy-chained loops of device drivers of FIG. 2.

FIG. 3 illustrates the switches/multiplexors 60–74 in more detail (although some have been omitted to simplify the drawing). Each switch has a data input "ISw" from the output of the previous switch or from the storage controller if this is the first switch in the sequence. This input is also connected to an input of a respective storage device. Each switch also has a data input "ISt" from the output of the respective storage device or storage controller. Each switch also has a data output "Out" to supply the data input "ISw" of the next switch in the sequence or the storage controller. Each switch also has a control input "C" to set the switch to pass either the ISw input or the ISt input to the data output of the switch. The control input is provided by a three input logical "AND" gate. For those switches/multiplexors 60–74 whose ISt inputs are supplied by a storage device, the inputs of the respective AND gate are provided by ESI processor 82, ESI processor 174 and the storage device itself. For those switches/multiplexors 120 and 121 whose ISt inputs are supplied by a storage controller, the inputs of the respective AND gate are provided by the storage controller, ESI processor 82 and ESI processor 174. When either storage controller 30 or 31 wants to communicate with ESI processor 82 to control a switch it does so through the loop 25 and ESI processor 174. Likewise, when either storage controller 30 or 31 wants to communicate with ESI processor 174 to control a switch is does so through the loop 24 and ESI processor 82.

When the ISw input is passed to the output, the respective storage device is considered "bypassed" because the output of the respective storage device (applied to the ISt input) is ignored and not propagated downstream. Thus, the bypass mode (or "port bypass mode") effectively removes the device driver from the loop so that communications from the upstream switch and storage device proceed to the downstream switch and storage device without being effected by the bypassed, intermediary storage device. As explained in more detail below, a storage device will be bypassed during a test mode and when the respective storage device fails, to prevent the failed storage device from interfering with communication downstream.

During normal operation, a host computer 60 will issue an I/O command to one of the storage controllers, for example, storage controller 20. Storage controller 20 will then determine where to store the data in the case of a write command and where the fetch the data in the case of a read command. For example, assume the storage location to which to be written or from which to be read is on storage device D13. Next, storage controller 20 selects one of the loops 24 or 25 to access storage device D13. In this example, assume that storage controller 20 selects loop 24 to access storage device D13; this being the default. (To share workload of the switches, in some scenarios, the storage controllers may be preprogrammed in a default mode to access the "even" numbered storage devices via loop 24 and the "odd" numbered storage devices via loop 25.) Next, storage controller 20 sends the command (including the nature of the request, the storage address and in the case of a write command, the data to be written) via device I/O processor 30 and a communication medium 65 to switch 120 which leads to switch 61 in the illustrated embodiment. Storage controller 20 also sends a control signal to switches 60–72 to be set in the bypass mode, and sends a control signal to switch 73 to read and propagate the output of storage device D13 (subsequent to the write operation). Thus, the command is propagated through switches 61–72 without regard for the outputs of storage devices D0–D12. However, the output of storage device D13 is of interest to storage controller 20. The command is passed to storage device D13 via the output of switch 72. In the case of a write command, the output of storage device 73 is simply an acknowledgment if the write was successful or an error message if the write was unsuccessful. (Alternately, after the data is written into the storage device, it can be read back and verified in the storage controller for accuracy.) This acknowledgment is supplied to input ISd of switch 73. In the case of a read command, the output of storage device D13 is the data at the address specified in the command. This data is supplied to input ISd of switch 73. Next, the response (an acknowledgment or error in the case of a write command or the read data in the case of a read command) is propagated to the storage controller via switch 74 and switch 60 which are set in the bypass mode.

As illustrated in FIG. 1, there can be additional JBOD boxes attached in series to JBOD boxes 14 and 16. If storage device 73 is in a second JBOD box/loop 26 in the series, then the command from storage controller 20 reaches the daisy chain of switches in JBOD box/loop 26 via the daisy chain of switches 60–74 in JBOD box14/loop 24. Likewise, if there is a JBOD box/loop downstream of the loop containing the storage device being accessed by storage controller 20, then the response from the storage controller may need to pass through this downstream loop before reaching storage controller 20.

Referring again to FIG. 2, if the attempt to access storage device D13 via switches 60–74 fails, storage controller 20 will attempt to identify and bypass the failed switch or respective storage device so that the remainder of the switches and respective storage devices in loop 24 can be utilized. The basic algorithm within storage controller 20 (and 21) for identifying and bypassing a failed switch/storage device is as follows. Storage controller 20 sends a port bypass command for all of the switches in loop 24 via loop 25, ESI processor 174 and ESI processor 82. Consequently, ESI processor 82 sets the port bypass mode for all of the SFP switches and storage device switches 60–74, and 121 and verifies that the loop is up when all devices are bypassed on this loop. This verification is performed by sending a Loop Initialization Signal ("LIP") including an identification of the storage controller, into one end of the daisy chain of bypassed switches and SFPs, and checking if the LIP is successfully returned via the other end. (The LIP signal is a loop reset/initialization primitive tagged with the sender ALPA ID.) Next, storage controller 20 resets/disables the port bypass mode for each of the switches 60–74, 97, 99 and 121 individually, such that one of the switches 60–74, 97, 99 and 121 at a time is accessible. This allows storage controller 20 to monitor the condition of one switch and associated storage device at a time because there are no intervening switches to potentially interfere. To monitor the condition of the switch and associated storage device which is not bypassed, the storage controller sends a LIP signal into one end (switches 120 and 61) of the daisy chain of switches 24 and then checks whether this LIP signal is returned via the other end (switch 74). The non bypassed storage device receives the LIP via the upstream switches and recognizes it as an LIP signal. The non bypassed storage device is programmed to automatically return the LIP signal to the downstream switch, so that it can be propagated back to the storage controller. If the LIP is successfully returned to the storage controller, this means that the non-bypassed switch and associated storage device are functioning properly. Storage controller 20 repeats this process for all of the switches and associated storage devices until the failed switch and/or storage device is identified, i.e. no LIP signal is returned. Storage controller 20 then sets the port bypass mode for the failed switch/storage device (until fixed) and resets/disables the port bypass mode for the other, good switches so that the storage devices associated with the good switches can be accessed.

If none of the switches/storage devices is bad, then storage controller 20 looks elsewhere for the problem, i.e. to the expansion, SFP ports and optical or copper cables which interconnect the loops. There are two such SFP ports for each loop. The JBOD boxes 42–44 are also daisy-chained, and one of the SFP ports of each JBOD box interconnects the next JBOD box in the daisy-chain, and the other SFP port of each JBOD box interconnects the previous JBOD box in the daisy chain. The general strategy to test each SFP port is to pass a LIP signal through it and the associated storage device switches after the storage device switches were found to be good. Accordingly, storage controller 20 sets all the switches in loops 24 into the bypass mode via ESI processor 174 and ESI processor 82 except for switches 97 and 99 in the next enclosure in the stacks as well as switch 120 for controller 20 in the base enclosure. So, none of the switches can impede the communication through the loop 24. Then, the storage controller 20 generates a LIP signal. The LIP signal will propagate through all bypassed switches 120, 61–73, 121 and 74 and then upstream through SFP port 89 ("upstream" is downward in the orientation of FIG. 3). Then, the LIP signal will propagate through the next enclosure Loop in the stack and back to the base enclosure and storage 20, and thereby test SFP port 89 and SFP port 91 of the next enclosure in the stack together. A successful test is indicated by a return of the LIP signal generated by controller 20 and injected into SFP port 89. Controller 20 can test SFP port 91 by bypassing switches 60–74, 121, bypassing SFP port 89 by selecting the ISw input of switch 99 and then generating a LIP signal which will pass through the loop of the next enclosure in the stack with non bypassed SFP switch and back through the base enclosure SFP 91 into the input of controller 20. Similarly, controller 20 can test SFP port 93 and 95 exactly the same way SFP ports 89 and 91 were tested, but now on loop 25 instead of loop 24.

Figure 4A:
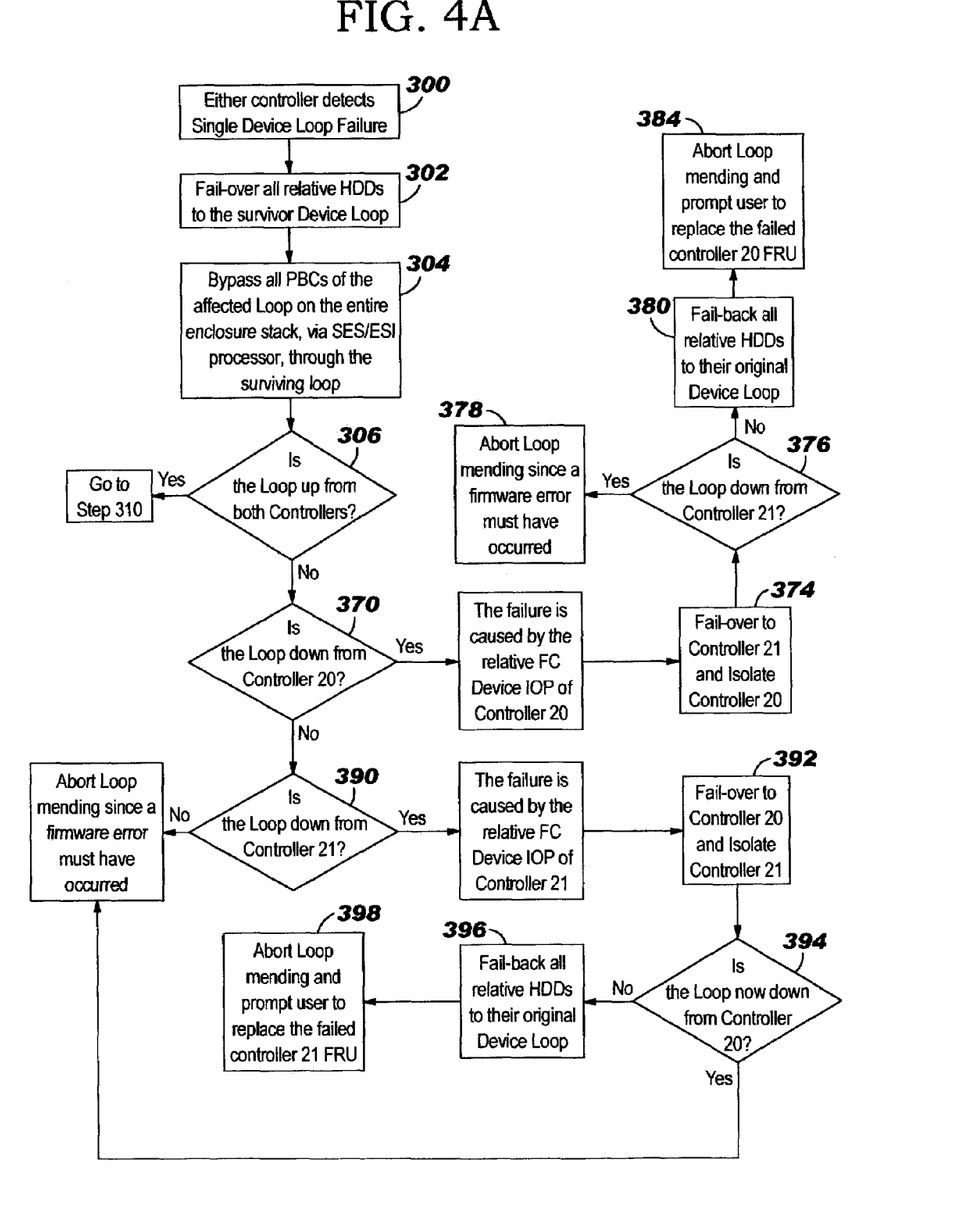
Figure 4B:
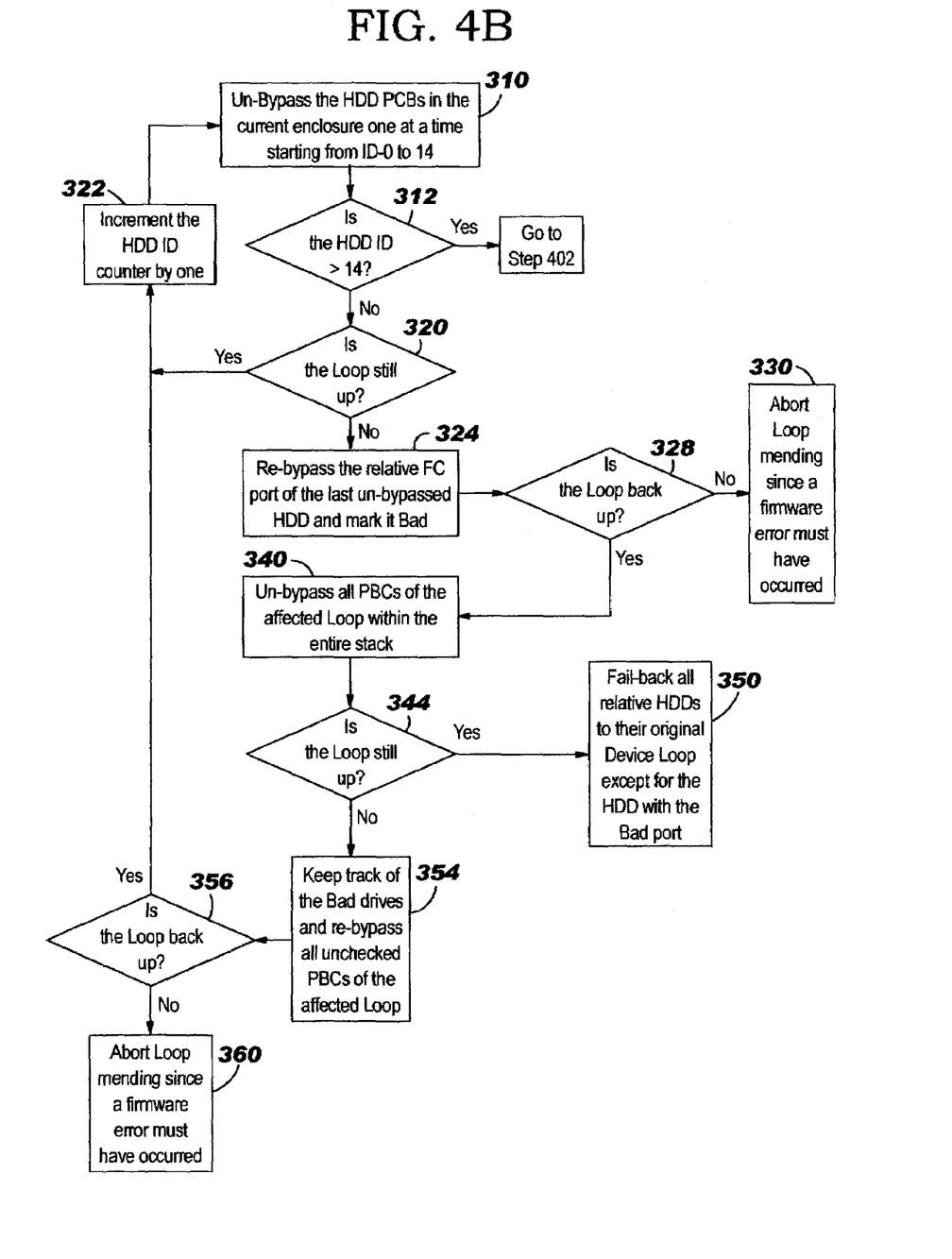
Figure 4C:
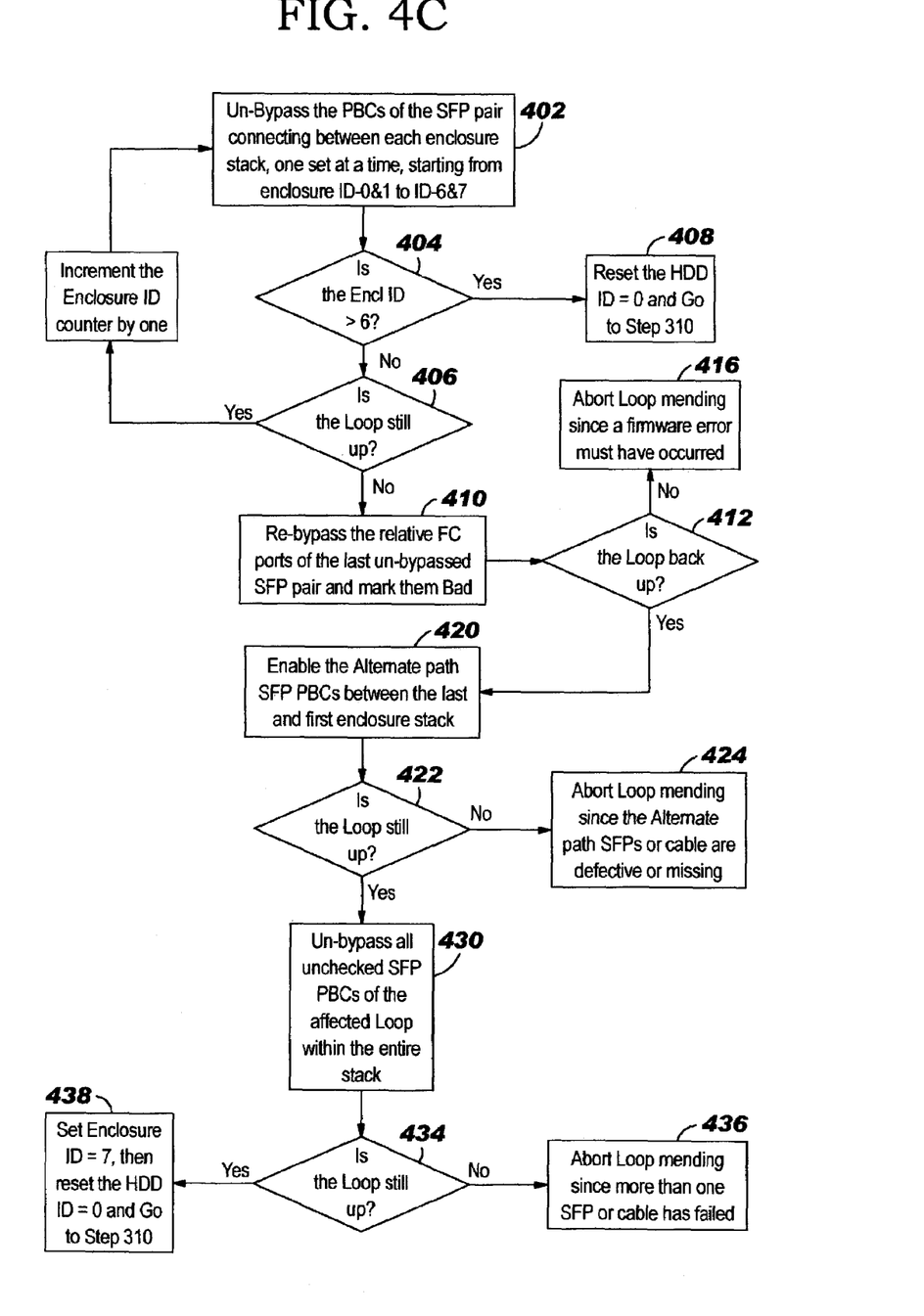

FIG. 4(a–c) is a flow chart illustrating the foregoing storage controller process in more detail for identifying and bypassing a failed device driver. In step 300 of FIG. 4(a), either storage controller detects a failure in a loop, for example, storage controller 20 detects a failure in loop 24. The storage controller detected the failure because a LIP signal injected into switch 60 did not return to the storage controller. (Each disk drive has a "preferred" access loop to divide workload through each loop. For example, each odd disk drive is typically accessed through loop 24 and each even disk drive is typically access through loop 25, assuming both loops are "up".) Next, storage controller 20 records an indication that loop 24 is down, and that all device access commands for all disk drives should be handled through loop 25 (step 302). Storage controller 20 notifies storage controller 21 that loop 24 is down and to failover to loop 25 (step 302). Next, storage controller 10 enables the port bypass circuits for all device drivers on loop 24 via loop 25, ESI processor 174, ESI multiplexing circuit 80 and ESI processor 82 as described above (step 304). Next, both storage controllers determine whether loop 24 is up (decision 306). This will be the case if the problem is one of the storage devices in loop 24. Next, storage controller 20 disables the port bypass circuit of each of the switches in loop 24, one at a time, enabling all the other port bypass circuits (step 310). For each disabling of the port bypass circuit for a switch in loop 24 (decision 312 and step 322), storage controller 20 determines if loop 24 is "up" by injecting the LIP signal into one end of the loop and checking for it to return from the other end of the loop (decision 320). If so, this indicates that the non-bypassed switch and associated storage device are good. If not, this indicates that the non-bypassed switch or associated storage device (such as switch 73 and device D13) is bad, and storage controller 20 "permanently" enables the port bypass circuit for this switch and associated storage device (step 324). (This port bypass circuit is enabled until the switch or associated storage device is fixed or replaced.) Next, storage controller 20 determines if loop 24 is up (decision 328). This should be the case unless there is a defect in the firmware of storage controller 20 (step 330). Assuming loop 24 is up with switch 73 permanently bypassed and all the other switches in loop 24 temporarily bypassed, storage controller 20 then disables the port bypass circuits for all switches in loop 24 other than switch 73 (step 340). Next, storage controller determines if loop 24 is up (decision 344). This will be the case if switch 73 or the associated storage device D13 is the only bad switch or device driver and there are no other problems in loop 24. In which case, storage controller 20 will proceed to access the storage devices through the previously specified/preferred loops, except for storage device D13 which it must access through the loop 25. Storage controller 20 will advise storage controller 21 that it can do the same (step 350).

Referring again to decision 344, if loop 24 is not up with the port bypass circuit for switch 73 enabled, this means that there is another failure in loop 24 of one of the other loops. Consequently, storage controller 20 enables the port bypass circuit for all switches in loop 24 that have not yet been checked; the port bypass circuit for switch 73 is still enabled (step 354). Next, storage controller 20 determines if loop 24 is up (decision 356). This should be the case unless there is an error in the firmware of storage controller 20, in which case the process is aborted (step 360). Assuming, the outcome of decision 356 is "yes", storage controller 24 returns to step 322, decision 312 and decision 320 to determine if the loop is "up" after the port bypass circuit of the next, previously-unchecked switch is enabled. The foregoing process is repeated until either loop 24 is up after one or more port bypass circuits are enabled (decision 344 and step 350) or the process is aborted in step 360.

Referring again to decision 306, if loop 24 is still down after all of its switches are bypassed, controller 20 determines if loop 24 is down from its perspective, i.e. its interface to loop 24 (decision 370). If so, the failure is caused by Fibre Channel I/O port 62 of loop 24, and controller 20 "fails over" to controller 21, i.e. controller 20 notifies host 60 that controller 20 cannot access loop 24 (step 374). Consequently, host 60 will direct all I/O requests for storage devices D0–D14 to storage controller 21. Next, controller 20 instructs controller 21 to determine if loop 24 is down from controller 21's perspective (decision 376). Controller 21 determines this by sending a LIP signal and expecting it to return. If loop 24 is down from the perspective of storage controller 21, then the problem is the firmware within a driver within I/O port 62 and controller 20 aborts its attempt to fix the problem (step 378). However, if loop 24 is up from controller 21's perspective, then storage controller 20 instructs storage controller 21 to access all storage devices via loop 25 (step 380). Finally, storage controller 20 instructs its administrator to replace the I/O port 62 (step 384).

Referring again to decision 370, if loop 24 is not down from controller 20's perspective, controller 20 instructs controller 21 to determine if loop 24 is down from controller 21's perspective (decision 390). If so, then the failure is caused by I/O port 63 of loop 24, and controller 20 will instruct host 60 to access storage devices D0–D14 via controller 20 instead of controller 21 (step 392). Next, controller 20 determines if loop 24 is down from its perspective (decision 394). If so, this indicates a firmware error within FC IOP driver, because just a short time earlier in decision 370 it was determined that loop 24 was up from the perspective of controller 20. If decision 394 indicates that loop 24 is up from controller 20's perspective, then controller 20 will access all storage devices D0–D14 via loop 24 (step 396). Finally, controller 20 instructs its administrator to replace I/O port 63 (step 398).

Referring again to decision 312, if neither loop 24 nor loop 25 via their respective I/O ports is identified as faulty (by a loop up state after bypassing), then controller 20 determines if the problem is with one of the Small Form Factor ("SFP") ports. Thus, controller 20 unbypasses the SFPs one or two at a time and bypasses the other switches and SFPs (step 402 and decision 404). In the illustrated example, there are six SFPs. After each SFP is tested, controller 20 determines if the loop 24 is up (decision 406) by injecting a "loop up" signal and checking for a return. If loop 24 remains up after each of the SFPs (or each two of the SFPs) is non bypassed with the other SFPs being bypassed, then none of them is defective. So, controller 20 resets the disk drive ID=0 to start the same detection process on the next shelf (step 408). Referring again to decision 406, if one of the SFPs is identified as faulty (because loop 24 is down when the SFP is non bypassed and the other SFPs are bypassed), then controller 20 enables this SFP (step 410) and checks again whether the loop 24 is up (decision 412). If not, this indicates a problem with the firmware within the driver of the I/O port, and controller 20 aborts its attempt to fix the problem (step 416). If loop 24 is now up, controller 20 enables an alternate path SFP between the last and first loop (step 420). Next, controller determines whether loop 24 is still up by injecting a "loop up" signal and checking for its return (decision 422). If not, there is a problem with the alternate path SFP or intervening cabling, and this alternate path is deselected (step 424). However, if the loop is still up, storage controller 24 then enables all the other SFPs (step 430), and then checks again if the loop is still up (decision 434). If not, this indicates that another of the SFPs or intervening cabling is defective, and the alternate path is deselected (step 436). However, if the loop is still up, then the fault is now isolated and the process is complete (step 438).

Based on the foregoing, a system and method for isolating a faulty switch, storage device or SFP port in a daisy-chained configuration of switches has been disclosed. However, numerous modifications and substitutions can be made without deviating from the scope of the present invention. For example, the expansion SFPs and cables can be Optical or Copper interconnects. Therefore, the invention has been disclosed by way of illustration and not limitation and reference should be made to the following claims to determine the scope of the present invention.

The invention claimed is:

1. A method for testing and operating a plurality of storage devices, each of said storage devices being connected to and accessible from a respective switch, the switches being connected in a sequence, each of said switches having a bypass mode where a test signal sent to the switch effectively bypasses the respective storage device and proceeds to a next switch in the sequence, each of said switches having a non bypass mode where the test signal proceeds to the respective storage device and elicits a response, said response being passed to a next switch in the sequence, said method comprising the steps of:

a storage controller setting all of said switches, except one, in the bypass mode, setting said one switch in the non bypass mode, and sending a test signal to an initial switch in said sequence, said test signal proceeding through the bypassed switches, if any, upstream of said one switch, to the storage device of said one switch, and if said storage device of said one switch is functioning properly, said storage device of said one switch returning said test signal to proceed through all other of the bypassed switches, if any, downstream of said one switch and back to said storage controller, and if said storage device of said one switch is not functioning properly, said storage device of said one switch not returning said test signal back to said storage controller, and said storage controller subsequently setting said one switch into the bypass mode during normal operation such that the storage devices connected to the other switches can be accessed despite improper function of the storage device connected to said one switch; and if said storage device of said one switch is functioning properly, repeating the foregoing steps with a different one of said switches being set in a non bypass mode and the other switches being set in the bypass mode.

2. A method as set forth in claim 1 wherein said switches are connected in a loop.

3. A method as set forth in claim 2 wherein said test signal is a Loop Initialization Signal and includes an identity of said controller.

4. A method as set forth in claim 2 wherein there is another loop of switches with respective storage devices, said other loop being connected between the first said loop and said storage controller, said other loop having an input port coupled to said storage controller to receive the test signal from said storage controller, said other loop having an output port coupled to said first loop to forward said test signal received by the input port to said first loop, and further comprising the step of said storage controller setting said input port and said output port of said other loop into a bypass mode for a time that said test signal is sent to said first loop.

5. A system for testing and operating a plurality of storage devices, each of said storage devices being connected to and accessible from a respective switch, the switches being connected in a sequence, each of said switches having a bypass mode where a test signal sent to the switch effectively bypasses the respective storage device and proceeds to a next switch in the sequence, each of said switches having a non bypass mode where the test signal proceeds to the respective storage device and elicits a response, said response being passed to a next switch in the sequence, said system comprising:

a storage controller including means for setting all of said switches, except one, in the bypass mode, setting said one switch in the non bypass mode, and sending a test signal to an initial switch in said sequence, said test signal proceeding through the bypassed switches, if any, upstream of said one switch, to the storage device of said one switch; and means, within said storage device of said one switch, responsive to said storage device of said one switch functioning properly, for returning said test signal to proceed through all other of the bypassed switches, if any, downstream of said one switch and back to said storage controller, wherein if said storage device of said one switch is not functioning properly, said storage device of said one switch does not return said test signal back to said storage controller; and said storage controller including means, responsive to lack of return of said test signal, for subsequently setting said one switch into the bypass mode during normal operation such that the storage devices connected to the other switches can be accessed despite improper function of the storage device connected to said one switch.

6. A system as set forth in claim 5 wherein said switches are connected in a loop.

7. A system as set forth in claim 6 wherein said test signal is a Loop Initialization Signal.

8. A method for testing and operating a plurality of loops, each of said loops comprising a multiplicity of switches connected in a switch sequence, each of said switches being coupled to a respective storage device, each of said loops also comprising an input port and an output port to interconnect said loops in a loop sequence such that the output port of each of said loops is connected to the input port of a next one of said loops in the loop sequence, each of said ports having a bypass mode and a non bypass mode, said method comprising the steps of:

a storage controller setting all of said ports, except one or two ports of a loop under test, in the bypass mode and setting said one or two ports in the non bypass mode, setting all of the switches of said loop under test to effectively bypass their respective storage devices, sending a test signal to an initial port in said loop sequence, said test signal proceeding through the bypassed ports, if any, upstream of said loop under test, to the input port of the loop under test; and if said one and two ports are functioning properly, said test signal proceeding through the bypassed switches of the loop under test and through all other of the bypassed ports, if any, downstream of said loop under test and back to said storage controller, said test signal traversing at least part of all of said plurality of loops, and if said one or two ports are not functioning properly, said test signal not proceeding back to said storage controller, and subsequently, during normal operation, said storage controller enabling alternate port(s) to access said loop which was under test and did not return the test signal; and if said one and two ports are functioning properly repeating the foregoing steps with a different one or two of said ports being set in a non bypass mode and the other ports being set in the bypass mode.

9. A method as set forth in claim 8 further comprising the step of replacing with functional ports said one or two ports of said loop under test which did not return the test signal.

10. A method as set forth in claim 8 further comprising an I/O port to interconnect said storage controller to one of said loops, such that said test signals traverse said I/O port to and from said storage controller.

11. A method as set forth in claim 8 wherein each of said test signals is a Loop Initialization Signal.

12. A method for testing and operating a plurality of storage devices, each of said storage devices being connected to and accessible from a respective switch, the switches being connected in a sequence, each of said switches having a bypass mode where a test signal sent to the switch effectively bypasses the respective storage device and proceeds to a next switch in the sequence, each of said switches having a non bypass mode where the test signal proceeds to the respective storage device and elicits a response, said response being passed to a next switch in the sequence, said method comprising the steps of:

a storage controller setting all of said switches, except one, in the bypass mode, setting said one switch in the non bypass mode, and sending a test signal to an initial switch in said sequence, said test signal proceeding through the bypassed switches, if any, upstream of said one switch, to the storage device of said one switch, and if said storage device of said one switch is functioning properly, said storage device of said one switch responding to said test signal, said response proceeding through all other of the bypassed switches, if any, downstream of said one switch and back to said storage controller, and if said storage device of said one switch is not functioning properly, said storage device of said one switch not responding properly to said test signal, and said storage controller subsequently setting said one switch into the bypass mode during normal operation such that the storage devices connected to the other switches can be accessed despite improper function of the storage device connected to said one switch; and if said storage device of said one switch is functioning properly, repeating the foregoing steps with a different one of said switches being set in a non bypass mode and the other switches being set in the bypass mode.

13. A method as set forth in claim 12 wherein said switches are connected in a loop.

14. A method as set forth in claim 13 wherein there is another loop of switches with respective storage devices, said other loop being connected between the first said loop and said storage controller, said other loop having an input port coupled to said storage controller to receive the test signal from said storage controller, said other loop having an output port coupled to said first loop to forward said test signal received by the input port to said first loop, and further comprising the step of said storage controller setting said input port and said output port of said other loop into a bypass mode for a time that said test signal is sent to said first loop.

* * * * *